United States Patent
Kinoshita (10) Patent No.: US 9,722,029 B2
(45) Date of Patent: Aug. 1, 2017

(54) SEMICONDUCTOR DEVICE AND METHOD OF MANUFACTURING SEMICONDUCTOR DEVICE

(71) Applicant: Fuji Electric Co., Ltd., Kanagawa (JP)

(72) Inventor: Akimasa Kinoshita, Nagano (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/345,996

(22) Filed: Nov. 8, 2016

(65) Prior Publication Data
US 2017/0179235 A1    Jun. 22, 2017

(30) Foreign Application Priority Data

Dec. 16, 2015 (JP) .................. 2015-244749

(51) Int. Cl.
| | | |
|---|---|---|
| *H01L 31/0312* | (2006.01) | |
| *H01L 29/16* | (2006.01) | |
| *H01L 29/739* | (2006.01) | |
| *H01L 29/36* | (2006.01) | |
| *H01L 29/06* | (2006.01) | |

(Continued)

(52) U.S. Cl.
CPC .... *H01L 29/1608* (2013.01); *H01L 21/02529* (2013.01); *H01L 29/0615* (2013.01); *H01L 29/36* (2013.01); *H01L 29/66325* (2013.01); *H01L 29/7393* (2013.01)

(58) Field of Classification Search
CPC ....... H01L 29/872; H01L 29/06; H01L 29/66; H01L 29/78; H01L 29/47; H01L 29/36; H01L 29/16; H01L 29/417; H01L 29/739; H01L 21/28; H01L 29/40; H01L 27/06; H01L 29/20; H01L 21/265; H01L 21/283
See application file for complete search history.

(56) References Cited

U.S. PATENT DOCUMENTS

| | | | |
|---|---|---|---|
| 6,831,345 B2 | 12/2004 | Kinoshita et al. | |
| 7,564,072 B2 | 7/2009 | Ohtsuka et al. | |
| 8,716,717 B2 | 5/2014 | Kawakami et al. | |

FOREIGN PATENT DOCUMENTS

| | | |
|---|---|---|
| JP | 2003-101039 A | 4/2003 |
| JP | 2006-165225 A | 6/2006 |

(Continued)

OTHER PUBLICATIONS

Shenai et al., "Optimum Semiconductors for High-Power Electronics", IEEE Transactions on Electron Devices, Sep. 1989, vol. 36, No. 9, pp. 1811-1823.

(Continued)

*Primary Examiner* — Robert Bachner
(74) *Attorney, Agent, or Firm* — Chen Yoshimura LLP (57) ABSTRACT

A semiconductor device includes an $n^+$ type silicon carbide substrate, and in the substrate an active region where primary current flows and an edge termination area surrounding the active region. The semiconductor device has a first p-type region and a second p-type region in the edge termination area, and the first p-type region includes therein a plurality of third p-type regions, and the second p-type region includes therein a plurality of fourth p-type regions. The widths between the respective plurality of third p-type regions and the widths between the respective plurality of fourth p-type regions become greater further away from the active region.

10 Claims, 3 Drawing Sheets

(51) Int. Cl.
    *H01L 29/66*     (2006.01)
    *H01L 21/02*     (2006.01)

(56) References Cited

FOREIGN PATENT DOCUMENTS

| JP | 2010-50147 A | 3/2010 |
|---|---|---|
| WO | 2012/049872 A1 | 4/2012 |

OTHER PUBLICATIONS

Baliga, "Silicon Carbide Power Devices", World Scientific Publishing Co., Mar. 30, 2006, p. 61.
Perez et al., "A highly effective edge termination design for SiC planar high power devices", Materials Science Forum, 2004, vol. 457-460, pp. 1253-1256.

SEMICONDUCTOR DEVICE AND METHOD OF MANUFACTURING SEMICONDUCTOR DEVICE

BACKGROUND OF THE INVENTION

Technical Field

The present invention relates to a semiconductor device and a method of manufacturing a semiconductor device.

Background Art

Silicon (Si) is conventionally used as the constituting material for power semiconductor devices, which control high voltages and large currents. There are several types of power semiconductor devices, such as bipolar or IGBTs (insulated gate bipolar transistors) and MOSFETs (metal oxide semiconductor field effect transistors), each specialized for different uses.

For example, bipolar transistors or IGBTs have higher current density than MOSFETs and can have large currents, but cannot be switched at high speeds. Specifically, bipolar transistors are limited to switching frequencies of several kHz, and IGBTs are limited to switching frequencies of several dozen kHz. On the other hand, power MOSFETs have lower current density than bipolar transistors or IGBTs and cannot easily have large currents, but can have high-speed switching operations of up to several MHz.

However, there is strong demand in the market for a power semiconductor device that has both large currents and high speed, and thus effort has been poured into improving IGBTs and power MOSFETs, to the point now where development has almost reached material limits. Therefore, there has been research into semiconductor materials to replace silicon in power semiconductor devices, and silicon carbide (SiC) has garnered attention as a semiconductor material that makes possible the fabrication (manufacturing) of next-generation power semiconductor devices with excellent low ON voltage, high speed properties, and high-temperature properties (see Non-patent Document 1 below, for example).

Silicon carbide is a very chemically stable semiconductor material, with a wide bandgap of 3 eV and capable of extremely stable use as a semiconductor even at high temperatures. Furthermore, silicon carbide also has a maximum electric field strength that is at least an order of magnitude greater than silicon, and thus shows promise as a semiconductor material that can sufficiently minimize ON resistance. These advantages of silicon carbide also apply to other semiconductors with wider bandgaps than silicon (hereinafter, "wide bandgap semiconductors"), such as gallium nitride (GaN). Hence, the use of wide bandgap semiconductors makes it possible to increase the breakdown voltage of semiconductor devices (see Non-patent Document 2, for example).

In this type of high breakdown voltage semiconductor device, a high voltage is applied not only to the active region where the device structure is formed and current flows in an ON state, but also to an edge termination area for maintaining the breakdown voltage disposed on the periphery around the active region, with the electric field being concentrated at the edge termination area. The breakdown voltage of a high breakdown voltage semiconductor device is determined by the impurity concentration, thickness, and electric field strength of the semiconductor, and the area of safe operation determined by the advantages inherent in semiconductors is the same from the active region to the edge termination area. Thus, there is a risk that the electric field concentrating at the edge termination area could cause an electrical charge exceeding the area of safe operation to be applied to the edge termination area, resulting in destruction of the structure. In other words, the breakdown voltage of the high breakdown voltage semiconductor device will be limited at the area of safe operation of the edge termination area.

There are well-known devices that reduce or disperse the electric field of the edge termination area in order to improve the breakdown voltage of the entire high breakdown voltage semiconductor device, such as devices having edge termination structures such as junction termination extension (JTE) structures or field limiting ring (FLR) structures in the edge termination area (see Patent Documents 1 and 2 below, for example). There is also a well-known semiconductor device that has floating metal electrodes in contact with the FLRs arranged as field plates (FPs) so as to discharge charge that is generated at the edge termination area, thereby improving reliability of the device (see Patent Document 1 below, for example).

However, a semiconductor device constituted by a wide bandgap semiconductor has a device structure that is formed on a semiconductor substrate with a higher impurity concentration than a semiconductor device made of silicon (see Non-patent Document 2 below, for example). Therefore, when forming the edge termination area with the FLR structure, the design requires microstructures of 1 μm or below, depending on the parameters, which makes it difficult to use a wide bandgap semiconductor due to the trouble of forming such microstructures therewith.

There are well-known methods to solve these problems, such as by using a structure in which areas of differing concentrations are nested therein (see Patent Documents 3 and 4 below, for example) or a structure having a high concentration p-type region arranged in a ring shape in a low concentration p-type region (see Non-patent document 3 below, for example).

RELATED ART DOCUMENTS

Patent Documents

Patent Document 1: Japanese Patent Application Laid-Open Publication No. 2010-50147
Patent Document 2: Japanese Patent Application Laid-Open Publication No. 2006-165225
Patent Document 3: WO 2012/049872
Patent Document 4: Japanese Patent Application Laid-Open Publication No. 2003-101039

Non-Patent Documents

Non-patent Document 1: Optimum Semiconductor for High-Power electronics, IEEE Transactions on Electronic Devices, K. Shenai et al., September 1989, vol. 36, no. 9, pp. 1811-1823
Non-patent Document 2: Silicon Carbide Power Devices, (USA), World Scientific Publishing Co., B. Jayant Baliga, Mar. 3 2006, p. 61
Non-patent Document 3: A highly effective edge termination design for SiC planar high power devices, Materials Science Forum, R. Perez et al., 2004, vol. 457-460, pp. 1253-1256

SUMMARY OF THE INVENTION

However, an edge termination structure in which areas of differing concentrations are nested therein is a microstructure, and thus requires a dry etching process each time a single region is formed, which complicates the manufacturing steps. Furthermore, an edge termination structure having a high concentration p-type region arranged in a ring shape in a low concentration p-type region narrows the allowable range of concentrations for p-type regions, which could greatly affect device properties due to variation in manufacturing steps. In addition, while an edge termination structure having a high concentration p-type region arranged in a ring shape in a low concentration p-type region does allow for the number of manufacturing steps to be simplified, such a structure narrows the acceptable amount of concentration variation for achieving high breakdown voltage.

In order to solve the problems caused by the conventional technology described above, the present invention aims at providing a semiconductor device and a method of manufacturing a semiconductor device having an edge termination structure that can reduce the number of manufacturing steps required when forming the edge termination structure and which is not susceptible to characteristics caused by variations in the manufacturing steps. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a semiconductor substrate of a first conductivity type made of a semiconductor having a wider bandgap than silicon; a semiconductor film of the first conductivity type deposited on a front surface of the semiconductor substrate, the semiconductor film being made of a semiconductor having a wider bandgap than silicon and having a lower impurity concentration than the semiconductor substrate; an active region including a metal semiconductor junction or a compound structure of a metal semiconductor junction and an insulating semiconductor junction in a front surface layer of the semiconductor film that is opposite to the front surface of the semiconductor substrate; an edge termination area surrounding the active region defined in the front surface layer of the semiconductor film; a first second-conductivity type region at least partially surrounding the active region; a second second-conductivity region in the edge termination area and surrounding the first second-conductivity type region; a plurality of third second-conductivity type regions having equal widths and disposed within the second second-conductivity type region at prescribed gaps from one another, the prescribed gaps becoming wider further away from the active region, the third second-conductivity type regions having a higher impurity concentration than the second second-conductivity type region and a lower impurity concentration than the first second-conductivity type region; a fourth second-conductivity type region in the edge termination area and surrounding the second second-conductivity type region, the fourth second-conductivity type region having a lower impurity concentration than the second second-conductivity type region; and a plurality of fifth second-conductivity type regions disposed within the fourth second-conductivity type region at prescribed gaps from one another, the prescribed gaps of the fifth second-conductivity type regions becoming wider further away from the active region, the fifth second-conductivity type regions having a higher impurity concentration than the fourth second-conductivity type region and a lower impurity concentration than the first second-conductivity type region.

Furthermore, in one aspect of the semiconductor device of the present invention, the plurality of third second-conductivity type regions have a higher impurity concentration than the plurality of fifth second-conductivity type regions.

Furthermore, in one aspect of the semiconductor device of the present invention, an amount of the plurality of third second-conductivity type regions is smaller than an amount of the plurality of fifth second-conductivity type regions.

Furthermore, in one aspect of the semiconductor device of the present invention, in the plurality of third second-conductivity type regions, a gap between the nth region from the active region and the (n+1)th region is narrower than a gap within the plurality of fifth second-conductivity type regions between the nth region from the active region and the (n+1)th region from the active region.

Furthermore, in one aspect of the semiconductor device of the present invention, among the plurality of fifth second-conductivity type regions and the widths thereof, a width of a 1st fifth second-conductivity type region is greater than a width of other fifth second-conductivity type regions.

Furthermore, in one aspect of the semiconductor device of the present invention, in the plurality of fifth second-conductivity type regions, the 1st fifth second-conductivity type region is at a boundary between the second second-conductivity type region and the fourth second-conductivity type region.

Furthermore, in one aspect of the semiconductor device of the present invention, the plurality of fifth second-conductivity type regions has a higher impurity concentration than the second second-conductivity type region.

Furthermore, in one aspect of the semiconductor device of the present invention, portions of the second second-conductivity type region where the third second-conductivity type regions are respectively disposed are deeper than other portions of the second second-conductivity type region.

Furthermore, in one aspect of the semiconductor device of the present invention, portions of the fourth second-conductivity type region where the fifth second-conductivity type regions are respectively disposed are deeper than other portions of the fourth second-conductivity type region.

Furthermore, in one aspect of the semiconductor device of the present invention, the semiconductor having a wider bandgap than silicon is silicon carbide.

In another aspect, the present disclosure provides a method of manufacturing a semiconductor device having a semiconductor substrate of a first conductivity type made of a semiconductor having a wider bandgap than silicon, a semiconductor film of the first conductivity type deposited on a front surface of the semiconductor substrate, the semiconductor film being made of a semiconductor having a wider bandgap than silicon and having a lower impurity concentration than the semiconductor substrate, an active region including a metal semiconductor junction or a compound structure of a metal semiconductor junction and an insulating semiconductor junction in a front surface layer of the semiconductor film opposite to the front surface of the semiconductor substrate, and an edge termination area surrounding the active region in the front surface layer of the semiconductor film, the method including: forming a first second-conductivity type region at least partially surrounding the active region; forming, in the edge termination area, a second second-conductivity region surrounding the first second-conductivity type region, and a plurality of third second-conductivity type regions having equal widths and disposed within the second second-conductivity type region at gaps that become wider further away from the active region, the third second-conductivity type regions having a higher impurity concentration than the second second-conductivity type region and a lower impurity concentration than the first second-conductivity type region; forming, in the edge termination area, a fourth second-conductivity type region surrounding the second second-conductivity type region, and a plurality of fifth second-conductivity type regions disposed within the fourth second-conductivity type region at gaps that become wider further away from the active region, the fifth second-conductivity type regions having a higher impurity concentration than the fourth second-conductivity type region and a lower impurity concentration than the first second-conductivity type region.

According to the invention described above, the edge termination area is constituted by a second second-conductivity type region and a plurality of third second-conductivity type regions within the second second-conductivity type region, and a fourth second-conductivity type region and a plurality of fifth second-conductivity type regions within the fourth second-conductivity type region. The widths of the plurality of third second-conductivity type regions becomes wider further away from the active region, and the widths of the plurality of fifth second-conductivity type regions becomes wider further away from the active region. Thus, the further away from the active region, the fewer impurities there are, and the plurality of third second-conductivity type regions and the plurality of fifth second-conductivity type regions can reduce or disperse electric fields affecting the edge termination area.

Furthermore, photolithography and ion implantation can form the plurality of third second-conductivity type regions and plurality of fifth second-conductivity type regions in a single round, which reduces the number of manufacturing steps for forming the edge termination area. Moreover, the gaps between the plurality of third second-conductivity type regions and the fifth second-conductivity type regions makes it possible to reduce the impurity concentration of the edge termination area. In addition, the reduction in the impurity concentration of the edge termination area does not rely on the impurity concentration of the plurality of third second-conductivity type regions and plurality of fifth second-conductivity type regions. Thus, the allowable range of impurity concentrations for the plurality of third second-conductivity type regions and fifth second-conductivity type regions is wider, and the edge termination area is not susceptible to influence from the ion implantation dosage or activation rate.

Furthermore, in the edge termination area there two types of regions where the impurity concentration becomes less further away from the region: the plurality of third second-conductivity type regions, and the plurality of fifth second-conductivity type regions, which has a lower impurity concentration than the plurality of third second-conductivity type regions; therefore, it is possible to have the same breakdown voltage performance in a shorter length as compared to if there were only one type of region where the impurity concentration became less further away from the region.

The semiconductor device and method of manufacturing the semiconductor device of the present invention makes it possible to reduce the number of manufacturing steps required during forming of the edge termination area and can provide an edge termination area that is resistant to characteristics caused by variation in the manufacturing steps.

It is to be understood that both the foregoing general description and the following detailed description are exemplary and explanatory, and are intended to provide further explanation of the invention as claimed.

DETAILED DESCRIPTION OF EMBODIMENTS

Suitable embodiments of a semiconductor device and a method of manufacturing a semiconductor device according to the present invention will be explained in detail below with reference to the attached drawings. In the present specification and attached drawings, electrons or holes in layers or areas marked with an "n" or "p" signify majority carriers. The "+" or "−" attached to the "n" or "p" respectively signify higher impurity concentrations and lower impurity concentrations than layers or areas without these marks. The "n" or "p" symbols including the attached "+" or "−" represent similar concentrations to other "n" or "p" symbols including the attached "+" or "−" and do not necessarily represent the same concentrations. In the explanation of the embodiments below and the attached drawings, the same reference characteristics are attached to similar configurations and repetitive descriptions will be omitted. Furthermore, when representing Miller indices in the present specification, "−" signifies a bar attached to the index immediately thereafter, and attaching a "−" before the index represents a negative index.

Embodiment 1

A semiconductor device in one aspect of the present invention is formed using a semiconductor with a wider bandgap than silicon (wide bandgap semiconductor). In Embodiment 1, a Schottky barrier diode (SBD) structure will be described as an example of a wide bandgap semiconductor such as a silicon carbide semiconductor device fabricated using silicon carbide (SiC).

Figure 1:
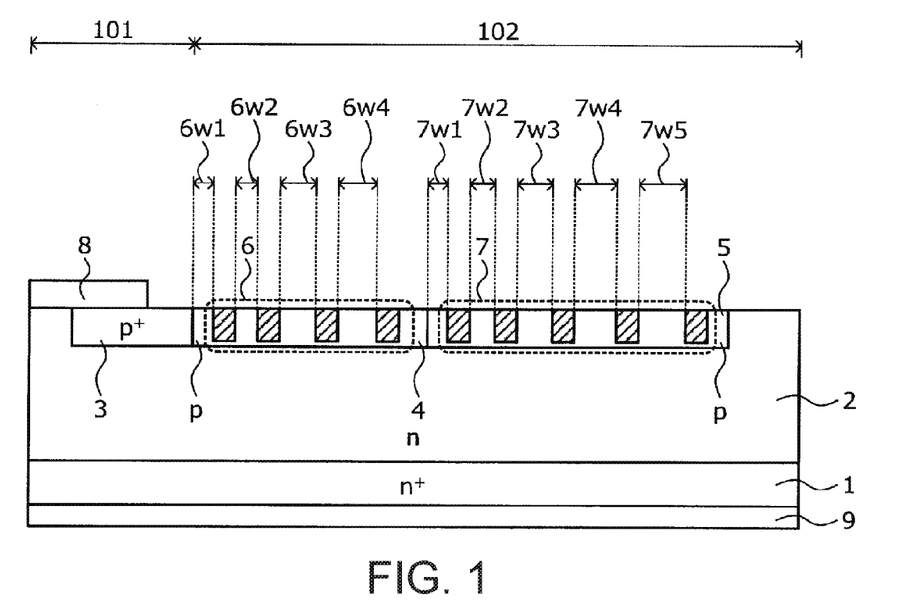
FIG. 1 is a cross-sectional view of a configuration of a silicon carbide semiconductor device according to Embodiment 1.

FIG. 1 is a cross-sectional view of a configuration of a silicon carbide semiconductor device according to Embodiment 1. As shown in FIG. 1, the silicon carbide semiconductor device of Embodiment 1 has a n-type silicon carbide epitaxial layer (a semiconductor deposited film of a first conductivity type) 2 deposited on a first primary surface (front surface) of an $n^+$ silicon carbide substrate (a semiconductor substrate of the first conductivity type) 1, such as the (0001) surface (Si surface).

The $n^+$ silicon carbide substrate 1 is a single-crystal silicon carbide substrate. The n-type silicon carbide epitaxial layer 2 is an n-type drift layer with a lower impurity concentration than the $n^+$ silicon carbide substrate 1. Hereinafter, the $n^+$ silicon carbide substrate 1 and the n-type silicon carbide epitaxial layer 2 collectively signify the silicon carbide semiconductor base substrate.

Furthermore, the surface of the n-type silicon carbide epitaxial layer 2 on the side opposite to the $n^+$ silicon carbide substrate 1 has a $p^+$ region (first second-conductivity type region) 3, a first p-type region (second second-conductivity type region) 4, and a second p-type region (fourth second-conductivity type region) 5 selectively formed therein.

The $p^+$ region 3 is in the active region 101 and connected to the edge termination area 102, which is provided on the periphery of the active region 101 and surrounds the active region 101. In this example, the active region 101 is a region including a metal semiconductor junction, or a composite structure of a metal semiconductor junction and an insulating semiconductor junction, where current flows when ON. The edge termination area 102 is a region that reduces the electric field on the base substrate surface side of the drift layer in order to maintain the breakdown voltage. The $p^+$ region 3 is on the active region 101 side where the diode device structure is disposed and connects to a Schottky electrode 8 that forms a Schottky contact with the n-type silicon carbide epitaxial layer 2.

The first p-type region 4 and the second p-type region 5 are in the edge termination area 102 and are arranged in parallel such that the $p^+$ region 3, the first p-type region 4, and the second p-type region 5 are arranged in this order from the active region 101 to the edge termination area 102. The impurity concentration of the first p-type region 4 is higher than the impurity concentration of the second p-type region 5. The first p-type region 4 includes therein a plurality of third p-type regions (third second-conductivity type regions) 6 (the portion indicated by a dotted line in FIG. 1), and the second p-type region 5 includes therein a plurality of fourth p-type regions (fifth second-conductivity type regions) 7 (the portion indicated by a dotted line in FIG. 1).

The gaps between the respective plurality of third p-type regions 6 become greater further away from the active region 101. If the respective gaps are denoted $6w2$, $6w3$, and $6w4$, then $6w2<6w3<6w4$, for example. The impurity concentration of the plurality of third p-type regions 6 is higher than the impurity concentration of the first p-type region 4. The widths between the respective plurality of fourth p-type regions 7 become greater further away from the active region 101. If the respective widths are denoted $7w2$, $7w3$, $7w4$, and $7w5$, then $7w2<7w3<7w4<7w5$, for example. Furthermore, the impurity concentration of the plurality of fourth p-type regions 7 is higher than the impurity concentration of the second p-type region 5.

In addition, it is preferable that the impurity concentration of the plurality of third p-type regions 6 be higher than the impurity concentration of the fourth p-type region 7. Moreover, it is preferable that the number of the plurality of third p-type regions 6 be less than the number of the plurality of fourth p-type regions 7. It is also preferable that, in the plurality of third p-type regions 6, the gap between the $n^{th}$ region (where n is a positive integer) from the active region 101 and the n+1st region be smaller than the gap between the $n^{th}$ region from the active region 101 and the n+1$^{st}$ region in the in the plurality of fourth p-type region 7. In FIGS. 1, $6w2<7w2$, $6w3<7w3$, and $6w4<7w4$, for example.

The surface of the $n^+$ silicon carbide substrate 1 opposite to the n-type silicon carbide epitaxial layer 2 (the rear surface of the silicon carbide semiconductor base substrate) has disposed thereon a rear surface electrode (Ohmic electrode) 9 that forms an Ohmic contact with the $n^+$ silicon carbide substrate 1. The rear surface electrode 9 constitutes a cathode electrode. The Schottky electrode 8, which constitutes an anode electrode, is formed on the surface of the n-type silicon carbide epitaxial layer 2 opposite to the $n^+$ silicon carbide substrate 1 (the front surface of the silicon carbide semiconductor base substrate). The Schottky electrode 8 is disposed in the active region 101.

(Method of Manufacturing Semiconductor Device of Embodiment 1)

Next, a method of manufacturing the silicon carbide semiconductor device of Embodiment 1 will be described using as an example the fabrication of a high breakdown voltage diode with an SBD structure having a breakdown voltage of at least 600V.

Figure 2:
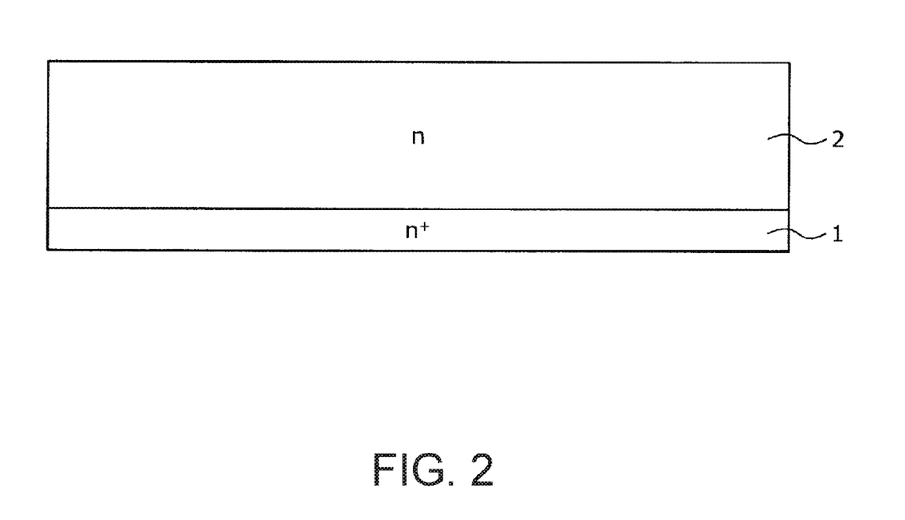
FIG. 2 is a first cross-sectional view of the silicon carbide semiconductor device of Embodiment 1 during manufacturing.
Figure 3:
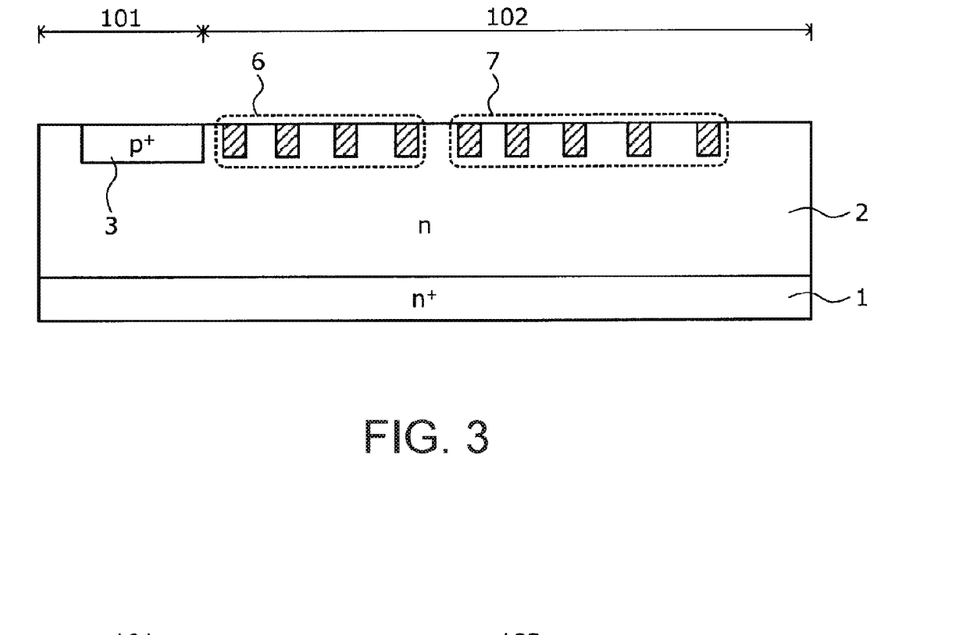
FIG. 3 is a second cross-sectional view of the silicon carbide semiconductor device of Embodiment 1 during manufacturing.
Figure 4:
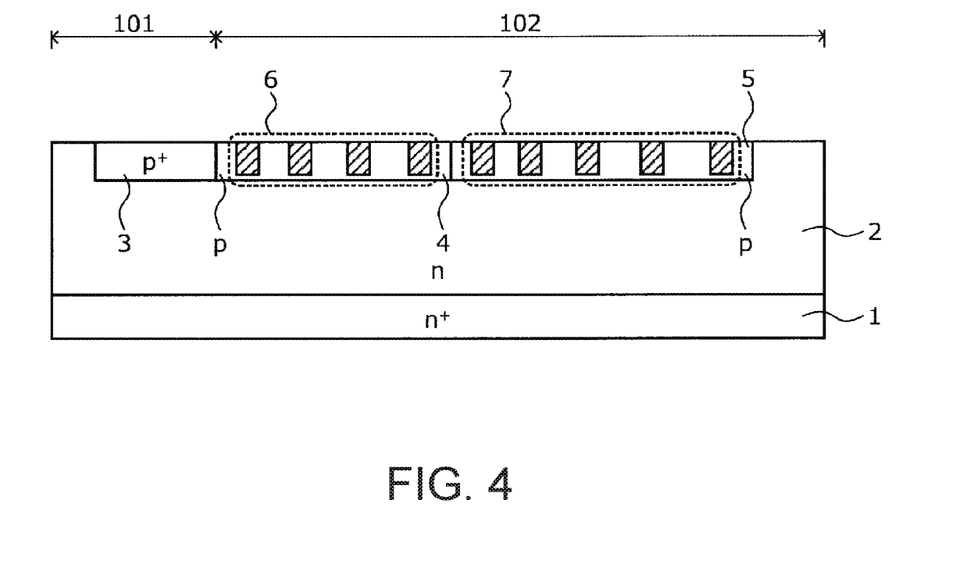
FIG. 4 is a third cross-sectional view of the silicon carbide semiconductor device of Embodiment 1 during manufacturing.

FIGS. 2 to 4 are cross-sectional views of the silicon carbide semiconductor device of Embodiment 1 during the manufacturing thereof. First, as shown in FIG. 2, the $n^+$ silicon carbide substrate 1, which has a thickness of 300 μm and is doped with nitrogen (N) at an impurity concentration of $1.0\times10^{18}/cm^3$ (for example), is prepared. The primary surface of the $n^+$ silicon carbide substrate 1 may be the (0001) surface, for example. Next, the 10 μm-thick n-type silicon carbide epitaxial layer 2, which has been doped with nitrogen at an impurity concentration of $1.0\times10^{16}/cm^3$, is epitaxially grown on the (0001) surface of the $n^+$ silicon carbide substrate 1. This state is shown in FIG. 2.

Next, as shown in FIG. 3, photolithography and ion implantation are used to selectively form the $p^+$ region 3 in the active region 101 of the surface layer of the n-type silicon carbide epitaxial layer 2. The $p^+$ region 3 is formed in a box profile at a depth of 0.5 μm and an impurity concentration of $3\times10^{19}/cm^3$ via multistage ion implantation of a p-type impurity such as aluminum (Al).

Next, photolithography and ion implantation are used to selectively form the plurality of third p-type regions 6 and the plurality of fourth p-type regions 7 in the edge termination area 102 of the surface layer of the n-type silicon carbide epitaxial layer 2. The plurality of third p-type regions 6 and the plurality of fourth p-type regions 7 are formed in a box profile at a depth of 0.45 μm and an impurity concentration of $1\times10^{17}/cm^3$ to $1\times10^{18}/cm^3$ via multistage ion implantation of a p-type impurity such as aluminum. This state is shown in FIG. 3.

Next, as shown in FIG. 4, photolithography and ion implantation are used to selectively form the first p-type region 4 in the edge termination area 102 of the surface layer of the n-type silicon carbide epitaxial layer 2. The first p-type region 4 is formed in a box profile at a depth of 0.5 μm and an impurity concentration of $5\times10^{16}/cm^3$ to $5\times10^{17}/cm^3$ via multistage ion implantation of a p-type impurity such as aluminum. This forms the first p-type region 4 around the plurality of third p-type region 6 such that the first p-type region 4 encompasses the plurality of third p-type regions 6. During this process, ion implantation is also performed on the plurality of third p-type regions 6 within the first p-type region 4; thus, the impurity concentration of the plurality of third p-type regions 6 is higher than the impurity concentration of the first p-type region 4.

Next, photolithography and ion implantation are used to selectively form the second p-type region 5 in the edge termination area 102 of the surface layer of the n-type silicon carbide epitaxial layer 2. The second p-type region 5 is formed in a box profile at a depth of 0.5 μm and an impurity concentration of $5 \times 10^{16}/cm^3$ to $5 \times 10^{17}/cm^3$ via multistage ion implantation of a p-type impurity such as aluminum. This forms the second p-type region 5 around the plurality of fourth p-type region 7 such that the second p-type region 5 encompasses the plurality of fourth p-type regions 7. During this process, ion implantation is also performed on the plurality of fourth p-type regions 7 within the second p-type region 5; thus, the impurity concentration of the plurality of fourth p-type regions 7 is higher than the impurity concentration of the second p-type region 5.

In this example, the impurity concentration for the multistage ion implantation during forming of the second p-type region 5 is lower than the impurity concentration for the multistage ion implantation during forming of the first p-type region 4. Thus, the impurity concentration of the first p-type region 4 is higher than the impurity concentration of the second p-type region 5. Furthermore, the second p-type region 5 can be formed first, and then the first p-type region 4 can be formed afterwards. This state is shown in FIG. 4.

Next, a nickel (Ni) film, for example, with a thickness of 50 nm is formed as the rear surface electrode 9 on the surface of the $n^+$ silicon carbide substrate 1 (on the rear surface of the silicon carbide semiconductor base substrate). Next, a heat treatment is performed for two minutes at a temperature of 1100° C. in an argon (Ar) atmosphere. This heat treatment forms an Ohmic contact between the $n^+$ silicon carbide substrate 1 and the rear surface electrode 9.

Next, a titanium (Ti) film, for example, with a thickness of 100 nm is formed as the Schottky electrode 8 on the entire front surface side of the $n^+$ silicon carbide substrate 1 so as to contact the n-type silicon carbide epitaxial layer 2 exposed to the active region 101. Next, the end of the titanium film closest to the edge termination area 102 is removed up to the top of the $p^+$ region 3. Next, a heat treatment is performed for five minutes at a temperature of 500° C. in an argon atmosphere. This heat treatment forms a Schottky contact between the n-type silicon carbide epitaxial layer 2 and the Schottky electrode 8. This completes the diode with the SBD structure shown in FIG. 1.

As described above, the edge termination area of Embodiment 1 is constituted by a first p-type region and a plurality of third p-type regions within this first p-type region, and a second p-type region and a plurality of fourth p-type regions within this second p-type region. The width between the respective plurality of third p-type regions becomes greater further away from the active region, and the width between the respective plurality of fourth p-type regions becomes greater further away from the active region. Therefore, the further away from the active region, the fewer impurities there are, and the plurality of third p-type regions and plurality of fourth p-type regions can reduce or disperse the electric field affecting the edge termination area.

Moreover, photolithography and ion implantation can be used to form the plurality of third p-type regions and plurality of fourth p-type regions at once, which reduces the number of manufacturing steps for forming the edge termination area. Furthermore, the gaps between the plurality of third p-type regions and plurality of fourth p-type regions can reduce the impurity concentration of the edge termination area. In addition, the reduction in the impurity concentration of the edge termination area is not reliant on the impurity concentration of the plurality of third p-type regions and plurality of fourth p-type regions. This increases the allowable range of impurity concentrations for the plurality of third p-type regions and plurality of fourth p-type regions, and the edge termination area is thus not susceptible to effects from the ion implantation dosage or activation rate.

Furthermore, the edge termination area has two types of regions where the impurity concentration becomes less further away: the plurality of third p-type regions, and the plurality of fourth p-type regions, which have a lower impurity concentration than the plurality of third p-type regions; therefore, it is possible to have the same breakdown voltage performance in a shorter length as compared to if there were only one type of region where the impurity concentration became less further away.

Embodiment 2

Figure 5:
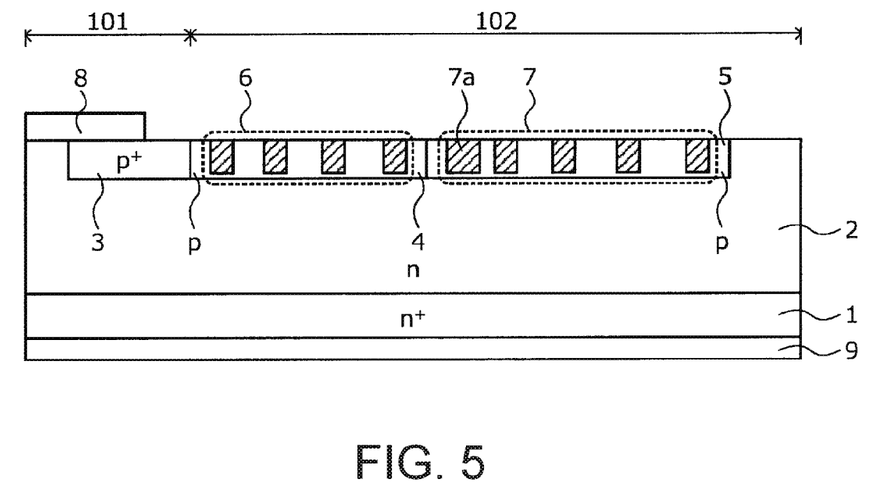
FIG. 5 is a cross-sectional view of a configuration of a silicon carbide semiconductor device according to Embodiment 2.

FIG. 5 is a cross-sectional view of a configuration of a silicon carbide semiconductor device according to Embodiment 2. As shown in FIG. 5, in the silicon carbide semiconductor device of Embodiment 2, the width of the first region of the plurality of fourth p-type regions 7 from the active region 101, or namely, the width of the fourth p-type region 7a, which is closest to the active region 101, is greater than the width of the other fourth p-type regions 7. Furthermore, the fourth p-type region 7a is formed at the border between the first p-type region 4 and the second p-type region 5.

The other configurations of the silicon carbide semiconductor device of Embodiment 2 are similar to the configurations of the silicon carbide semiconductor device of Embodiment 1, and thus overlapping explanations will be omitted.

(Method of Manufacturing Semiconductor Device of Embodiment 2)

Next, a method of manufacturing a semiconductor device according to Embodiment 2 will be described. The configuration of the silicon carbide semiconductor device of Embodiment 2 differs from that of Embodiment 1 in the width and position of the fourth p-type region 7a. Therefore, the silicon carbide semiconductor device of Embodiment 2 can be manufactured by using a mask suited for the fourth p-type region 7a as the ion implantation mask during forming of the plurality of fourth p-type regions 7.

Moreover, the structure in Embodiment 2 increases the tolerance of the position at the border between the first p-type region 4 and the second p-type region 5, which makes it possible to reuse the ion implantation mask after forming the plurality of third p-type regions 6 and plurality of fourth p-type regions 7. For example, when forming the first p-type region 4 before the second p-type region 5, the mask for forming the first p-type region 4 can be formed by removing the portions of the mask used for forming the plurality of third p-type regions 6 and plurality of fourth p-type regions 7 corresponding to the first p-type region 4 via wet etching. This mask can be used to form the first p-type region 4. It should be noted that, if this mask is used, impurities will be implanted again into the plurality of third p-type regions 6, but this is not a problem as long as the impurity concentration of the plurality of third p-type regions 6 does not become higher than the impurity concentration of the $p^+$ region 3. Furthermore, this mask can be used to form the mask for forming the second p-type region 5 by removing the portions corresponding to the second p-type region 5 via wet etching. It should be noted that, if this mask is used, impurities will be implanted again into the first p-type region 4, plurality of third p-type regions 6, and plurality of fourth p-type regions 7, but this is not a problem as long as the impurity concentration of the first p-type region 4 does not become higher than the impurity concentration of the plurality of fourth p-type regions 7. Optimizing the ion implantation procedure in this manner makes it possible to reduce the number of manufacturing steps in which multiple-round ion implantation masks are recreated.

The other aspects of the method of manufacturing the silicon carbide semiconductor device of Embodiment 2 are similar to the aspects of the method of manufacturing the silicon carbide semiconductor device of Embodiment 1, and thus overlapping explanations will be omitted.

As described above, Embodiment 2 increases the tolerance of the position at the border between the first p-type region and the second p-type region, which makes it possible to reuse the ion implantation mask after forming the plurality of third p-type regions and plurality of fourth p-type regions. This makes it possible to simplify the manufacturing steps for forming the ion implantation mask.

Embodiment 3

Figure 6:
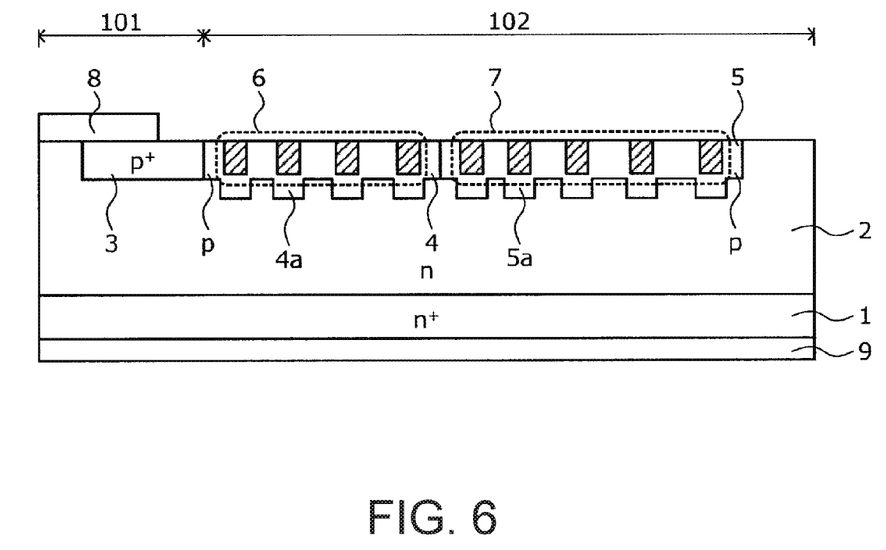
FIG. 6 is a cross-sectional view of a configuration of a silicon carbide semiconductor device according to Embodiment 3.

FIG. 6 is a cross-sectional view of a configuration of a silicon carbide semiconductor device according to Embodiment 3. As shown in FIG. 3, in Embodiment 3, the thickness of a portion 4a of the first p-type region 4 overlapping the third p-type region 6 is greater than other portions of the first p-type region 4. Furthermore, the thickness of a portion 5a of the second p-type region 5 overlapping the fourth p-type region 7 is greater than other portions of the second p-type region 5. In other words, the portion 4a in the first p-type region 4 overlapping the third p-type region 6 is deeper than other portions of the first p-type region 4. In addition, the portion 5a in the second p-type region 5 overlapping the fourth p-type region 7 is deeper than other portions of the second p-type region 5.

The other configurations of the silicon carbide semiconductor device of Embodiment 3 are similar to the configurations of the silicon carbide semiconductor device of Embodiment 1, and thus overlapping explanations will be omitted.

(Method of Manufacturing Semiconductor Device of Embodiment 3)

Next, a method of manufacturing a semiconductor device according to Embodiment 3 will be described. First, in a similar manner to Embodiment 1, the manufacturing process is performed in order from the step of forming the n-type silicon carbide epitaxial layer 2 to the step of forming the plurality of third p-type regions 6 and plurality of fourth p-type regions 7.

Next, by reusing the ion implantation mask used in the step of forming the plurality of third p-type regions 6 and plurality of fourth p-type regions 7, an additional ion implantation is performed on the deeper portions 4a and 5a of the first p-type region 4 and second p-type region 5 at a dosage adjusted such that the first p-type region 4 and the second p-type region 5 have equal impurity concentrations.

Thereafter, in a similar manner to Embodiment 1, the forming step of the first p-type region 4 or the second p-type region 5 is performed in order to complete the silicon carbide semiconductor device of Embodiment 3.

As described above, in Embodiment 3, the portion of the first p-type region overlapping the third p-type region is deeper than other portions of the first p-type region, and the portion of the second p-type region overlapping the fourth p-type region is deeper than other portions of the second p-type region. This increases the distance between the plurality of third p-type regions and plurality of fourth p-type regions from the n-type silicon carbide epitaxial layer and forms pn junctions at a position that is deeper than the corner portions of the plurality of third p-type regions and plurality of fourth p-type regions. This makes it possible to reduce the concentration of electric fields at the corner portions of the plurality of third p-type regions and plurality of fourth p-type regions.

In the present invention described above, an example was described in which the primary surface of the silicon carbide substrate, which is made of silicon carbide, was the (0001) surface and in which a SBD was formed on this (0001) surface, but the present invention is not limited to this, and various modifications can be made to the type of wide bandgap semiconductor used (such as by using gallium nitride [GaN], for example), the plane orientation of the substrate primary surface, or the like.

Furthermore, in respective embodiments of the present invention, the first conductivity type is n-type, and the second conductivity type is p-type, but the present invention is applicable even when the first conductivity type is p-type and the second conductivity type is n-type.

Moreover, in the present invention, the edge termination structure of an SBD is described, but the present invention is applicable even when the active region is a transistor structure such as a MOS.

INDUSTRIAL APPLICABILITY

As described above, the semiconductor device and the method of manufacturing the semiconductor device of the present invention is useful for high breakdown voltage semiconductor devices used in power supply devices in various types of industrial machinery and power conversion devices, for example.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
    a semiconductor substrate of a first conductivity type made of a semiconductor having a wider bandgap than silicon;
    a semiconductor film of the first conductivity type deposited on a front surface of the semiconductor substrate, the semiconductor film being made of a semiconductor having a wider bandgap than silicon and having a lower impurity concentration than the semiconductor substrate;
    an active region including a metal semiconductor junction or a compound structure of a metal semiconductor junction and an insulating semiconductor junction in a front surface layer of the semiconductor film that is opposite to the front surface of the semiconductor substrate;
    an edge termination area surrounding the active region defined in the front surface layer of the semiconductor film;
    a first second-conductivity type region at least partially surrounding the active region;

a second second-conductivity region in the edge termination area and surrounding the first second-conductivity type region;

a plurality of third second-conductivity type regions having equal widths and disposed within the second second-conductivity type region at prescribed gaps from one another, said prescribed gaps becoming wider further away from the active region, the third second-conductivity type regions having a higher impurity concentration than the second second-conductivity type region and a lower impurity concentration than the first second-conductivity type region;

a fourth second-conductivity type region in the edge termination area and surrounding the second second-conductivity type region, said fourth second-conductivity type region having a lower impurity concentration than the second second-conductivity type region; and a plurality of fifth second-conductivity type regions disposed within the fourth second-conductivity type region at prescribed gaps from one another, said prescribed gaps of the fifth second-conductivity type regions becoming wider further away from the active region, the fifth second-conductivity type regions having a higher impurity concentration than the fourth second-conductivity type region and a lower impurity concentration than the first second-conductivity type region.

2. The semiconductor device according to claim 1, wherein the plurality of third second-conductivity type regions have a higher impurity concentration than the plurality of fifth second-conductivity type regions.

3. The semiconductor device according to claim 1, wherein an amount of the plurality of third second-conductivity type regions is smaller than an amount of the plurality of fifth second-conductivity type regions.

4. The semiconductor device according to claim 1, wherein, in the plurality of third second-conductivity type regions, a gap between the nth region from the active region and the (n+1)th region is narrower than a gap within the plurality of fifth second-conductivity type regions between the nth region from the active region and the (n+1)th region from the active region.

5. The semiconductor device according to claim 1, wherein, among the plurality of fifth second-conductivity type regions and the widths thereof, a width of a 1st fifth second-conductivity type region is greater than a width of other fifth second-conductivity type regions.

6. The semiconductor device according to claim 5, wherein, in the plurality of fifth second-conductivity type regions, the 1st fifth second-conductivity type region is at a boundary between the second second-conductivity type region and the fourth second-conductivity type region.

7. The semiconductor device according to claim 1, wherein the plurality of fifth second-conductivity type regions has a higher impurity concentration than the second second-conductivity type region.

8. The semiconductor device according to claim 1, wherein portions of the second second-conductivity type region where the third second-conductivity type regions are respectively disposed are deeper than other portions of the second second-conductivity type region.

9. The semiconductor device according to claim 1, wherein portions of the fourth second-conductivity type region where the fifth second-conductivity type regions are respectively disposed are deeper than other portions of the fourth second-conductivity type region.

10. The semiconductor device according to claim 1, wherein the semiconductor having a wider bandgap than silicon is silicon carbide.

* * * * *

UNITED STATES PATENT AND TRADEMARK OFFICE
CERTIFICATE OF CORRECTION

PATENT NO. : 9,722,029 B2
APPLICATION NO. : 15/345996
DATED : August 1, 2017
INVENTOR(S) : Akimasa Kinoshita It is certified that error appears in the above-identified patent and that said Letters Patent is hereby corrected as shown below:

Column 7, Line 2, the text "$n^{30}$" should be changed to -- $n^+$ --.

Column 8, Line 1, the text "FIGS. 1" should be changed to -- FIG. 1 --.

Signed and Sealed this
Twenty-fourth Day of April, 2018

Andrei Iancu
*Director of the United States Patent and Trademark Office*